(12) United States Patent
Suhara

(10) Patent No.: US 7,309,884 B2
(45) Date of Patent: Dec. 18, 2007

(54) SEMICONDUCTOR LIGHT RECEIVING DEVICE AND METHOD OF FABRICATING THE SAME

(75) Inventor: Hajime Suhara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 600 days.

(21) Appl. No.: 10/824,540

(22) Filed: Apr. 15, 2004

(65) Prior Publication Data

US 2004/0259287 A1    Dec. 23, 2004

(30) Foreign Application Priority Data

Apr. 15, 2003    (JP)    ............................ P2003-110251

(51) Int. Cl.
*H01L 29/739*    (2006.01)
(52) U.S. Cl. .................. 257/200; 257/233; 257/440; 257/461; 257/E31.059; 257/E31.121
(58) Field of Classification Search ................ 257/200, 257/233, 440, 460–461; 438/48
See application file for complete search history.

(56) References Cited

U.S. PATENT DOCUMENTS 6,396,117 B1 *  5/2002  Furukawa et al. .......... 257/440

6,521,968 B2    2/2003  Kuhara et al.
7,167,498 B2 *  1/2007  Mallecot et al. ......... 372/50.21

FOREIGN PATENT DOCUMENTS

JP    2-231775    9/1990
JP    2860695    2/1999

* cited by examiner

*Primary Examiner*—A. Sefer
(74) *Attorney, Agent, or Firm*—Oblon, Spivak, McClelland, Maier & Neustadt, P.C.

(57) ABSTRACT

A semiconductor light receiving device is disclosed which is capable of receiving a first wavelength band light beam and a second wavelength band light beam having a shorter wavelength than that of the first wavelength band light beam. The device has a light absorbing layer of a first conductivity type formed on a semiconductor surface region of the semiconductor substrate the light absorbing layer absorbs the first and second wavelength band light beams. A cap layer of the first conductivity type is formed on the light absorbing layer. In the cap layer, a region of a second conductivity type is formed which transmits the second wavelength band light beam. A light collecting layer is formed on the semiconductor surface region and adjacently to the cap layer and the light absorbing layer. The light collecting layer has a convex shape with curvature to collect the second wavelength band light beam.

8 Claims, 3 Drawing Sheets

SEMICONDUCTOR LIGHT RECEIVING DEVICE AND METHOD OF FABRICATING THE SAME

CROSS REFERENCE TO RELATED APPLICATION

This application is based upon and claims the benefit of priority from the prior Japanese Patent Application No.2003-110251, filed on Apr. 15, 2003, the entire contents of which are incorporated herein by reference.

FIELD OF THE INVENTION

The present invention relates to a semiconductor light receiving device and method of fabricating the semiconductor light receiving device, which is capable of receiving light beams including long and short wavelength bands.

DESCRIPTION OF THE BACKGROUND

A semiconductor light receiving device for use in an optical fiber communication (hereinafter referred to as "optical communication ") is a device to convert a light signal transmitted through an optical fiber into an electric signal. In a long-range transmission through principal lines, a long wavelength band light beam such as a 1.55 micron band or 1.3 micron band is utilized currently.

In an optical communication, a 1(one) micron level band including a 1.55 or 1.3 micron band is classified as a long wavelength, while a 0.8 micron level band raging from 0.8 to 0.9 micron is classified as a short wavelength.

For convenience, wavelengths are classified in accordance with a classificatory criterion (border line) of about 0.9 micron almost in the same way as classification adopted in an optical communication.

InGaAs/InP based material is used for such a semiconductor light receiving device. InGaAs/InP based material is adaptive for along wavelength band light beam.

An InGaAs/InP semiconductor light receiving device is disclosed in U.S. Pat. No. 6,521,968. The device has a laminated structure of an n-type InP buffer layer formed on an n-type InP substrate, an InGaAs light absorbing layer formed on the buffer layer, and an n-type InP cap layer formed on the light absorbing layer. In fabrication, these layers are laminated on the n-type InP substrate in the above order. A p-type layer is formed by diffusing p-type dopants such as Zn selectively into an region to be a light receiving portion of the n-type InP cap layer. A protecting layer such as SiN is formed on the n-type InP cap layer. A light reflection preventing layer such as SiN is formed on the p-type layer.

A ring-like electrode is formed on a peripheral portion of the p-type layer. Another electrode is formed on a lower surface of the n-type InP substrate.

In the semiconductor light receiving device, incident light signal is absorbed in a depletion layer when a reverse bias voltage is applied to a pn junction of the InGaAs light absorbing layer and the p-type layer. As a result, Electrons and holes are generated in the depletion layer so that a light current is detected by the drift of the Electrons and holes caused by an electrical field. The band gap of the n-type InP cap layer is larger than that of the n-type InGaAs light absorbing layer. This is for the purpose of preventing the contributory ratio of minority carriers generated in the depletion layer to the light current from decreasing by the influence of surface recombination of the minority carriers. A portion of the n-type InP cap layer is turned into p-type to form the p-type layer Thus, the semiconductor light receiving device operates by a light beam having a wavelength longer than approximately 0.92 micron which is restricted by the band gap of InP, and shorter than approximately 1.67 micron which is restricted by the band gap of InGaAs. The semiconductor light receiving device has sensitivity to a light beam ranging from a 1.0 to 1.6 micron wavelength practically, so that the device has characteristic sufficiently covering wavelengths which are used in a conventional optical communication for a long range transmission. In recent years, demand for transmission of large amount of information such as picture images increases more and more.

A high speed network, which is capable of transmitting information to a distance ranging from several 100 m to several 10,000 meter is standardized. Long-range transmission is based on an optical communication technology for a principal line system and uses a long wavelength such as a 1.55 or 1.3 micron band. Short-range transmission uses a short wavelength of a 0.85 micron band is used.

In order to popularize the optical communication network, the semiconductor light receiving device is desired which may receive both long and short wavelength band light beams and be formed in a body. Furthermore, there is a problem that such an InGaAs/InP semiconductor light receiving device is difficult to receive a short wavelength light beam of a 0.85 micron band, as its sensitivity against a short wavelength band light beam is restricted by the 0.92 micron wavelength corresponding to the band gap of the p-type InP layer (window layer) formed on the surface of a light incident side.

In order to avoid such a problem, a semiconductor light receiving element is proposed in Japanese Patent Publication (Kokai) No. 2-231775. This element has an InP cap layer thinned to below 0.1 micron so that a light beam may be transmitted through the InP cap layer for practical use, though part of an incident light beam of a 0.7 to 0.8 micron band, for example, is absorbed in the InP cap layer. However, the semiconductor light receiving element has the problem that amount of dark current increases steeply when a bias voltage exceeds 5V.

Another semiconductor light receiving element is proposed in Japanese Patent No. 2,860,695. In fabrication of this element, a very small amount of Al (aluminum) is doped into an InP cap layer, so that the band gap of the cap layer is enlarged. Consequently, the light absorption coefficient of the InP cap layer is reduced and absorption of incident light decreases, so that the receiving light sensitivity of the element increases. There is a problem that the receiving light sensitivity is not sufficient though it inclines to increase.

To summarize the above, the semiconductor light receiving device of U.S. Pat. No. 6,521,968 is difficult to receive a short wavelength band beam below 0.9 micron. The semiconductor light receiving element of Japanese Patent Publication (Kokai) No. 2-231775 has a problem of increase of dark current. Further, the semiconductor light receiving element of Japanese Patent No. 2,860,695 has a problem that its receiving light sensitivity is insufficient.

SUMMRY OF THE INVENTION

According to an aspect of the invention is to provide a semiconductor light receiving device comprising a semiconductor substrate, a light absorbing layer of a first conductivity type formed on a semiconductor surface region of the semiconductor substrate which absorbs a light beam including a first wavelength band and a light beam including a second wavelength band having a shorter wavelength than the wavelength of the first wavelength band, a cap layer of the first conductivity type formed on the light absorbing layer, a region of a second conductivity type formed in the cap layer to transmit the light beam including the second wavelength band and a light collecting layer formed on the semiconductor surface region adjacently to the cap layer and the light absorbing layer which has a convex shape with curvature in at least a portion of a surface of the light collecting layer to transmit and collect the light beam including the second wavelength band to the light absorbing layer.

According to another aspect of the invention is to provide a method of fabricating a semiconductor light receiving device comprising forming a light absorbing layer of a first conductivity type on a semiconductor surface region of a semiconductor substrate which absorbs a light beam including a first wavelength band and a light beam including a second wavelength band having a shorter wavelength than the wavelength of the first wavelength band, forming a cap layer of the first conductivity type on the light absorbing layer, forming a semiconductor layer on the semiconductor surface region of the semiconductor substrate adjacently to the cap layer and the light absorbing layer which transmit the light beam including the second wavelength band, forming a region of a second conductivity type in the cap layer by introducing impurities giving the second conductivity type into the cap layer, forming a light collecting layer by processing a semiconductor layer to form a convex shape with curvature in at least a portion of a surface of the light collecting layer to transmit and collect the light beam including the second wavelength band to the light absorbing layer.

DETAILED DESCRIPTION OF THE INVENTION

Embodiments of the present invention will be described below in detail with reference to the drawings.

Figure 1:
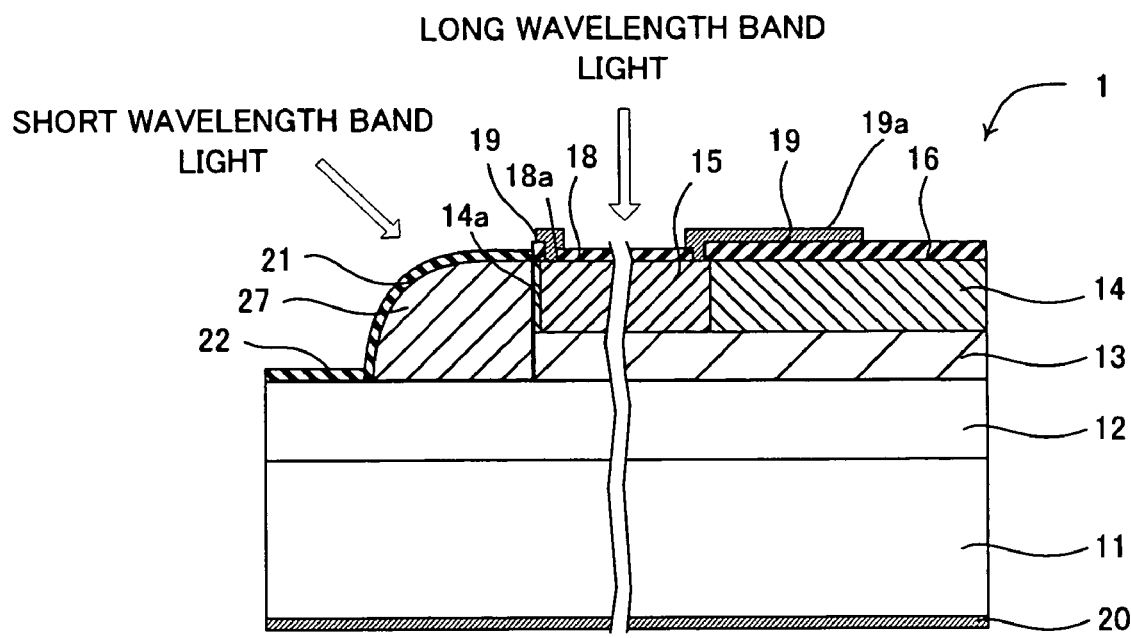
FIG. 1 shows a schematic cross-section of a first embodiment of a semiconductor light receiving device according to the present invention.
Figure 2:
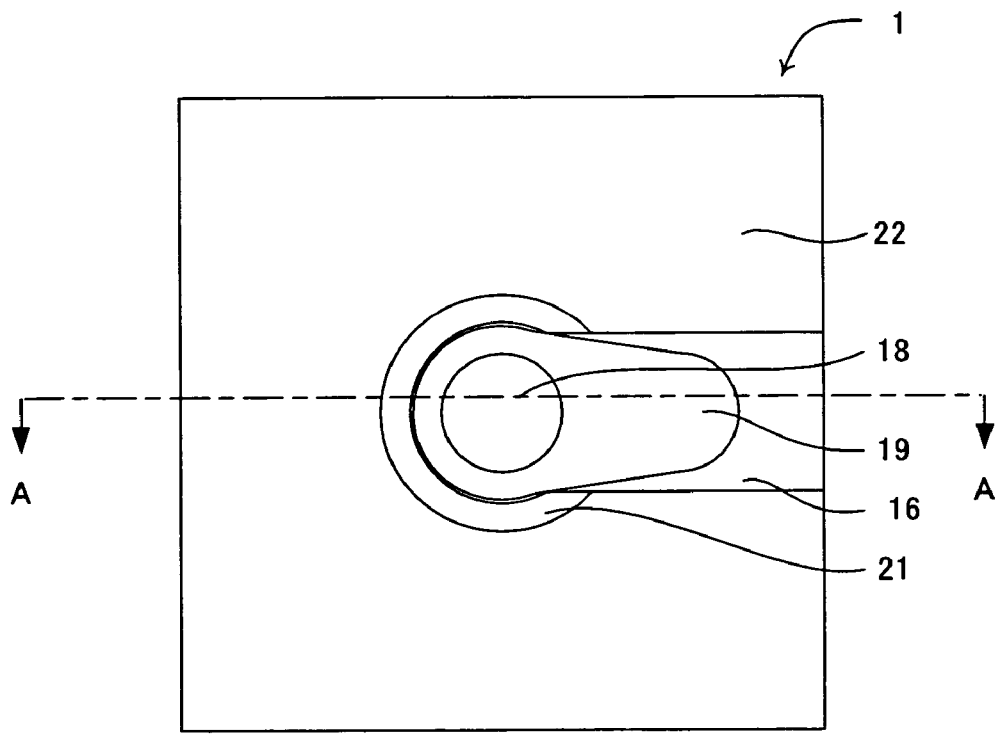
FIG. 2 shows a schematic plan view of the first embodiment of the semiconductor light receiving device according to the present invention in a smaller scale.

With reference to FIGS. 1 and 2, a semiconductor light receiving device of a first embodiment according to the invention is hereinafter explained. FIG. 1 shows a schematic cross-section of the semiconductor light receiving device. FIG. 2 shows a schematic plan view of the semiconductor light receiving device in about one fifths scale of FIG. 1. FIG. 1 is a enlarged sectional view taken along line A-A in FIG. 2.

In FIG. 1, semiconductor light receiving device 1 is an InGaAs/InP based. An n-type InP buffer layer 12, which has an 1-5 E $18/cm^3$ carrier concentration and a 2-3 micron thickness, is formed entirely on an upper main surface of n-type InP substrate 11 as a semiconductor substrate 11. Substrate 11 has a 1-7 E $18/cm^3$ carrier concentration. N-type InP buffer layer 12 constitutes a semiconductor surface region of the semiconductor substrate. An InGaAs light absorbing layer 13, which has a 0.8-2 E $15/cm^3$ carrier concentration and an about 1 micron thickness is selectively formed on portion of a surface of buffer layer 12. An n-type InP cap layer 14, which has an 1-5 E $15/cm^3$ carrier concentration and a 3 micron thickness, is formed on the light absorbing layer 13.

A p-type region 15 of a 1-10 E $19/cm^3$ carrier concentration is formed as a second conductivity-type region by diffusing p-type dopants such as zinc (Zn) selectively into an region of n-type InP cap layer 14. P-type region 15 serves as a window layer constituting a light receiving portion of device 1 to receive a light beam including a long wavelength band. A first light reflection preventing film 18 such as SiN is formed on the p-type layer 15. A protecting film 16 such as SiN is formed on n-type InP cap layer 14. Film 18 has a 0.2 micron thickness or smaller, and film 16 has a 0.3 micron thickness.

A GaAlAs light collecting layer 27 is provided on a portion of a surface of n-type InP buffer layer 12 to be positioned adjacently to and to have contact with side surfaces of InGaAs light absorbing layer 13 and a narrow portion 14a of n-type InP cap layer 14. GaAlAs light collecting layer 27 has a convex shape with curvature to collect incident light including a short wavelength band into InGaAs light absorbing layer 13. A light reflection preventing film 21 such as SiN is formed on GaAlAs light collecting layer 27. A light reflection preventing film 21 has a 0.08-0.12 micron thickness. A protecting film 23 is formed on an exposed part of the surface of n-type InP buffer layer 12. Protecting film 22 is formed of such a material as material of second light reflection preventing film 21.

As shown in FIGS. 1 and 2, a ring-like electrode 19 containing gold (Au) as a principal constituent is formed on a peripheral portion of the surface of p-type layer 15 through a ring-like opening 18a of first light reflection preventing film 18. Ring-like electrode 19 has a bonding pad portion 19a which extends over protecting film 16 and is connected to a bonding wire. Another plate-like electrode 20 containing gold as a principal constituent is formed on a lower main surface opposite to an upper main surface of n-type InP substrate 11. In this embodiment, the diameter of the light receiving portion is 30 microns, for example, which corresponds to a diameter of first light reflection preventing layer 18. The width of ring-like electrode 19 is 5 micron, for example, which surrounds first light reflection preventing film 18. The width of second light reflection preventing film 21 is 5 microns, in a plane direction, for example, which is provided outside of ring-like electrode 19.

A method of fabricating a semiconductor light receiving device, which has the same structure as that of the above-mentioned semiconductor light receiving device, will be hereinafter explained with reference to FIGS. 3A to 3E. FIGS. 3A to 3E show schematic cross-sections of the semiconductor light receiving device according to the method.

Figure 3A:
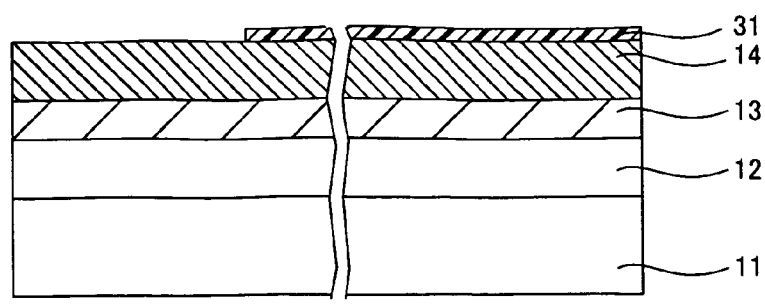
FIGS. 3A to 3E show schematic cross-sections of a semiconductor light receiving device fabricated according to a first embodiment of a method of fabricating a semiconductor light receiving device in accordance with the present invention.

In FIG. 3A, an n-type InP substrate 11, which has an 1-7 E $18/cm^3$ carrier concentration, is placed in an MOCVD (Metal Organic Chemical Vapor Deposition) apparatus. An N-type InP buffer layer 12, which has an 1-5 E $18/cm^3$ carrier concentration and a 2-3 micron thickness, is grown on n-type InP substrate 11 by MOCVD.

An InGaAs light absorbing layer 13 is grown selectively on a portion of a surface of buffer layer 12 by MOCVD. Lattices of InGaAs light absorbing layer 13 are conformed to the lattices of buffer layer 12. InGaAs light absorbing layer 13 has a 0.8-2 E $15/cm^3$ carrier concentration and an about 1 micron thickness. An N-type InP cap layer 14, which has an 1-5 E $15/cm^3$ carrier concentration and a 3 micron thickness, is grown on the light absorbing layer 13 by MOCVD. After this step, n-type InP substrate 11 is taken out from the MOCVD apparatus. A photo resist 31 is formed on a portion of a surface of n-type InP cap layer 14, in order to extend from a right side end of the device in FIG. 3A. Photo resist 31 covers a surface including regions where a pn junction and a bonding pad are to be formed. N-type InP cap layer 14 and InGaAs light absorbing layer 13 are selectively removed to a depth extending to a surface of n-type InP buffer layer 12. Layers 13 and 14 are removed selectively utilizing such a method as dry etching or wet etching using a hydrogen chloride (HCl) based liquid chemical, under existence of photo resist 31 as a mask.

Figure 3B:
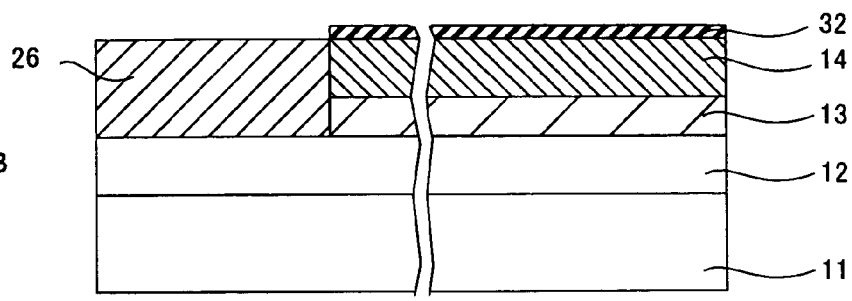

After photo resist 31 is removed, a $SiO_2$ film is formed on a whole surface. A photo resist mask is formed on the $SiO_2$ film. The $SiO_2$ film is removed selectively using the photo resist mask. After this, the photo resist mask is removed. Thus, as shown in FIG. 3B, a $SiO_2$ mask 32 is formed on a portion of the surface of n-type InP cap layer 14, which extends from a right side end in FIG. 3A, n-type InP substrate 11 is placed in a MOCVD apparatus again. A GaAlAs layer 26 is grown selectively on an exposed portion of the surface of n-type InP buffer layer 12, which coincides with the surface of n-type InP cap layer 14 substantially and has contact with side surfaces of n-type InP cap layer 14 and InGaAs light absorbing layer 13. N-type InP substrate 11 is taken out of the MOCVD apparatus. After this step, $SiO_2$ mask 32 is removed.

Figure 3C:
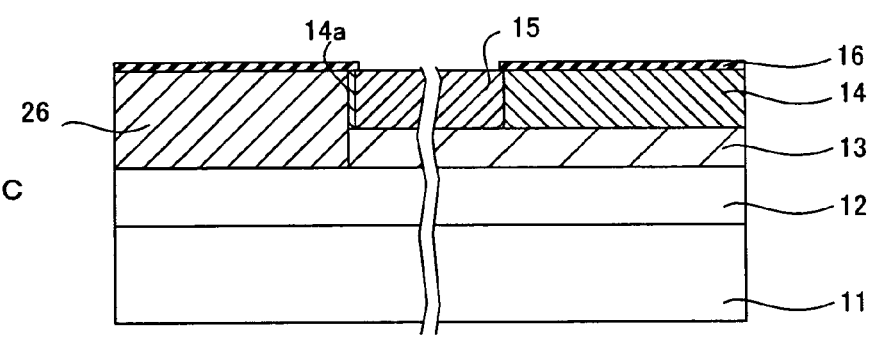

As shown in FIG. 3C, a protecting layer 16 of a 0.2 micron thickness such as SiN is formed on the surfaces of n-type InP cap layer 14 and GaAlAs layer 26 by a known CVD method, for example. After this step, an opening is formed in a region of protecting film 16. P-type region 15 is formed as a second conductivity-type region by selectively diffusing zinc (Zn) as p-type dopants from the surface of n-type InP cap layer 14 using a known thermal diffusion method. This thermal diffusion is performed so that the diffusion of the zinc (Zn) may stop when a pn junction reach InGaAs light absorbing layer 13.

Figure 3D:
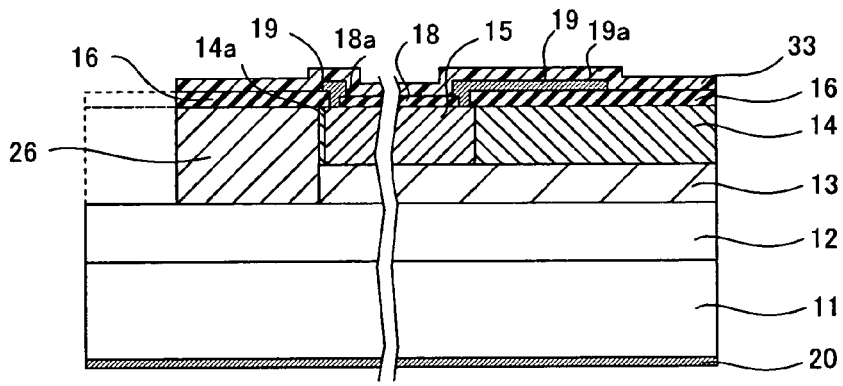

After this step, as shown in FIG. 3D, a first light reflection preventing film 18 such as SiN is deposited on p-type layer 15 and protecting film 16. Film 18 has a 0.2 micron thickness. A ring-like opening 18a is formed in first light reflection preventing layer 18. A photo mask having a pattern for use of a Lift-off method is formed and a conductive film containing gold (Au) as a principal constituent is deposited by such a method as a vapor deposition. Further, an unnecessary portion of the conductive film is removed with removal of the photo mask, so that a ring-like electrode 19 is formed which contacts with p-type layer 15. Electrode 19 is formed in a ring-like shape to surround a periphery of first light reflection preventing film 18 of an about 30 micron diameter, for example. Further, electrode 19 is formed to have a bonding pad portion 19a as a portion of the ring-like body which extends over a upper portion of protecting film 16. After this step, a back-side surface of n-type InP substrate 11 is polished and removed by a Chemical Mechanical Polishing (CMP) so that substrate 11 may have a 120 to 200 micron thickness and a mirror surface. A conductive film containing gold (Au) as a principal constituent is formed by a vapor deposition, and a thermal treatment is performed so that an plate-like electrode 20 is formed. By this thermal treatment, ohmic contact of electrodes 19 and 20 is obtained respectively.

Figure 3E:
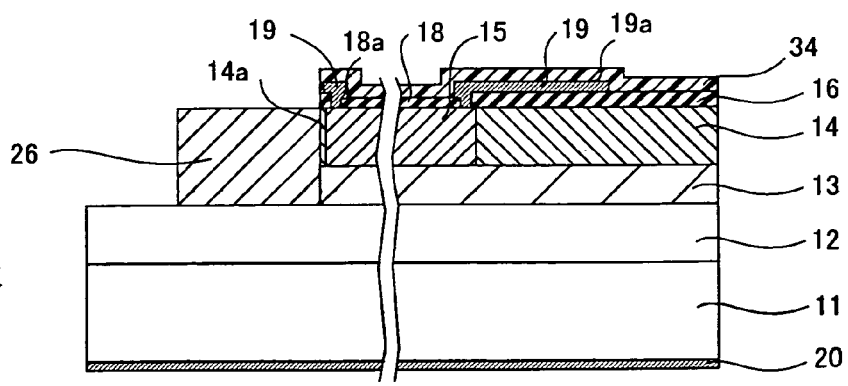

A photo resist 33, for example, is coated on an entire surface of protecting film 16, first light reflection preventing film 18 and electrode 19. An opening is formed in photo resist 33, and a portion of photo resist 33 formed on GaAlAs layer 26 is removed which extends from a left side of substrate 11 to a position about 5 microns apart from a left side of n-type cap layer 14 in a left direction. Portions of protecting film 16 and GaAlAs layer 26, which are shown in a dotted line in FIG. 3D, are removed perpendicularly to the surface of substrate 11 in this order, using photo resist 33 as a mask. After this step, photo resist 33 is removed as a whole. As shown in FIG. 3E, a photo resist pattern 34 is formed on an entire surface of protecting film 16, first light reflection preventing film 18 and electrode 19. Protecting film 16 formed on GaAlAs layer 26 is removed using photo resist 34 as a mask, so that GaAlAs layer 26 is exposed.

GaAlAs layer 26 is etched by an isotropic etching with a sulfuric acid based chemical using photo resist 34 as a mask, so that a GaAlAs light collecting layer 27 with a convex-lens-like section is formed. Layer 27 has a curved surface with a convex shape and a curvature, because an etching rate of a portion of GaAlAs layer 26 to be etched becomes larger as the portion is closer to a corner of GaAlAs layer 26. The convex shape curvature changes according to the etching condition. GaAlAs layer 26 may be grown thicker or thinner in the step shown in FIG. 3B to obtain a desirable shape of GaAlAs layer 26 in the step shown in FIG. 3E.

After this step, as shown in FIG. 1, a photo resist, for example, is formed to cover an area including protecting layer 16, first light reflection preventing film 18 and electrode 19. A silicon nitride (SiN) film of a 0.08-0.12 micron thickness, for example, is formed on a whole surface. After this step, the photo resist and the SiN formed on the photo resist are removed, so that semiconductor light receiving device 1 is completed as shown in FIG. 1. The SiN film remained includes a second light reflection preventing layers 21 and a protecting layer 22 formed on n-type InP buffer layer 12.

The semiconductor light receiving device in accordance with the above embodiment has a structure which may receive a light beam including a long wavelength band through p-type region 15 and a light beam including a short wavelength band through GaAlAs light collecting layer 27 respectively. The light beams including long and short wavelength bands are absorbed in InGaAs light absorbing layer 13 commonly.

In other words, as shown in FIG. 1, a light beam including a long wavelength band, for example, of a 1.55 micron or 1.3 micron may be incident through first light reflection preventing layer 18 and p-type region 15, for example, in a direction perpendicular to n-type InP substrate 11 substantially (shown with an arrow in FIG. 1). The incident light goes into p-type region 15 and light absorbing layer 13 so that the incident light is converted into electrical energy.

On the other hand, a light beam including a short wavelength band, for example, of a 0.85 micron may incident through second light reflection preventing film 21, for example, in a direction inclined by several 10 degrees from the direction perpendicular to n-type InP substrate 11 substantially (shown with an arrow in FIG. 1). The incident light go through GaAlAs light collecting layer 27 into light absorbing layer 13 so that the incident light is converted into electrical energy. The band gap of GaAlAs light collecting layer 27 may be changed according to composite rate of Ga and As. But the band gap of GaAlAs light collecting layer 27 is larger than that of n-type cap layer 14. For example, when the wavelength corresponding to the band gap of GaAlAs light collecting layer 27 is set to 0.75 micron, the light beam including a short wavelength band, for example, of a 0.85 micron is scarcely absorbed in light collecting layer 27 and may be transmitted to light absorbing layer 13. GaAlAs light collecting layer 27 is formed in a convex-lens-like shape. Thus, light collecting layer 27 may collect the incident light and transmit the light to light absorbing layer 13 efficiently so that a sufficient conversion efficiency of the incident light may be obtained.

P-type region 15 serves as a window layer to suppress surface recombination of carriers by a light beam including a long wavelength band. A sufficient conversion efficiency may be maintained by preventing reduction of conversion efficiency due to recombination of minor carriers generated in n-type InGaAs light absorbing layer 13.

Further, when cap layer 14 or P-type region 15 (the window layer) is thin, a problem of increase of dark current occurs due to generation of a high electric field. P-type region 15 may have a thickness enough to prevent such a problem. The pn junction may be the same structure as a structure of a conventional semiconductor light receiving device. Thus, the area or capacity of the pn junction hardly increases so that even a 10 Gbps transmitting speed may be obtained.

P-type region 15 serves to suppress surface recombination of carriers by the light beam including the short wavelength band light as well as by the light beam including the long wavelength band. High conversion efficiency may be obtained by preventing reduction due to recombination of minor carriers generated in n-type InGaAs light absorbing layer 13.

The semiconductor light receiving device in accordance with the embodiment can be made only by adding light collecting layer 27 with a narrow width of about 5 microns to a structure of a conventional device. Thus, the size of the semiconductor light receiving device 1 is almost unchanged so that a conventional packaging substrate may be used to mount the semiconductor light receiving device 1.

As both of the light beams including the short and long wavelength band respectively can be incident from a main surface side of n-type InP substrate 11, the semiconductor light receiving device may be manufactured easily compared with a case where one of the light beams is incident from a back side of substrate 11.

The right side of GaAlAs light collecting layer 27 does not have direct contact with p type region 15, but has contact with narrow portion 14a of n-type InP cap layer 14. Thus, generation of leak current may be suppressed.

Figure 4:
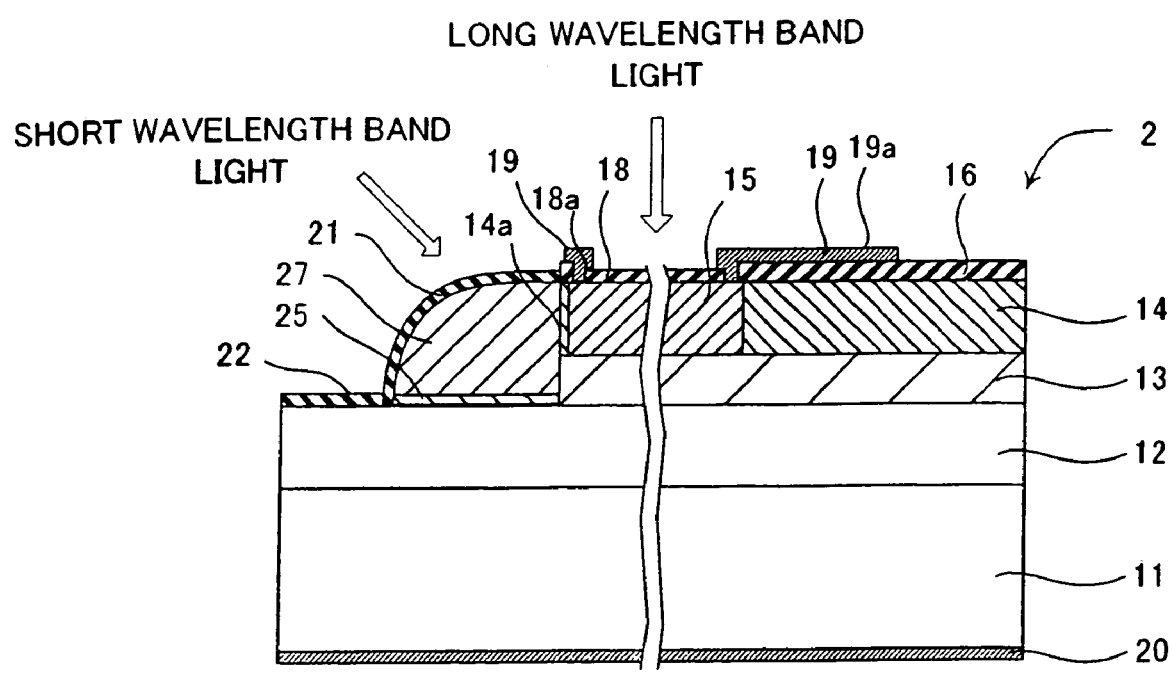
FIG. 4 shows a schematic cross-section of a second embodiment of a semiconductor light receiving device according to the present invention.

A semiconductor light receiving device of a second embodiment according to the invention is hereinafter explained with reference to FIG. 4. FIG. 4 shows a schematic cross-section of the semiconductor light receiving device. With respect to each portion of the second embodiment, the same portion of the first embodiment shown in FIG. 1 is designated by the same reference numeral.

This second embodiment differs from the first embodiment in that an InAlAs intermediate layer 25 is formed between n-type InP buffer layer 12 and GaAlAs light collecting layer 27, and that the intermediate layer 25 has a lattice constant between those of buffer layer 12 and light collecting layer 27.

As shown in FIG. 4, InAlAs intermediate layer 25, which has an about 0.1 micron thickness, is formed between GaAlAs light collecting layer 27 and n-type InP buffer layer 12 formed on a surfaces of n-type (a first conductivity type) InP substrate 11. InAlAs intermediate layer 25 has a 0.575 nm lattice constant between a 0.587 nm lattice constant of n-type InP buffer layer 12 and a 0.566 nm lattice constant of GaAlAs light collecting layer 27, for example.

A method of fabricating the semiconductor light receiving device 2 of FIG. 4 will be explained. After the step of FIG. 3A in the first embodiment, n-type InP cap layer 14 and n-type InGaAs light absorbing layer 13 are removed selectively by etching, and subsequently photo resist 31 is removed as shown in the step of FIG. 3B, . After this step, a $SiO_2$ mask 32, for example, is formed on a portion of the surface of n-type InP cap layer 14 which extends from a right side of the substrate 11. N-type InP substrate 11 is placed in a MOCVD apparatus. On an portion of the surface of n-type InP buffer layer 12, InAlAs intermediate layer 25 of a 0.575 nm lattice constant is grown, which is between a 0.587 nm lattice constant of n-type InP buffer layer 12 and a 0.566 nm lattice constant of GaAlAs layer 26, for example. Intermediate layer 25 has an about 0.1 micron thickness.

Further, GaAlAs layer 26 is formed on InAlAs intermediate layer 25. GaAlAs layer 26 has a surface which coincides almost with that of n-type InP cap layer 14, and has contact with side surfaces of n-type InP cap layer 14 and InGaAs light absorbing layer 13. N-type InP substrate 11 is taken out of the MOCVD apparatus, and $SiO_2$ mask 32 is removed. After this step, device 2 of FIG. 4 is completed according to the same steps as the steps starting from FIGS. 3C of the first embodiment.

The semiconductor light receiving device in accordance with the second embodiment shows advantages similar to the above mentioned advantages of the first embodiment. Furthermore, the semiconductor light receiving device in accordance with the second embodiment shows additional advantages other than the advantages similar to those of the first embodiment. The additional advantage is, for example, to soften distortion caused due to lattice unconformity, by inserting InAlAs intermediate layer 25 between n-type InP buffer layer 12 and GaAlAs light collecting layer 27.

Thus, lattice defects of GaAlAs layer 26 can be reduced, so that light transmission rate of light collecting layer 27 may increase, and generation of unusual surface roughness may be prevented when GaAlAs layer 26 is processed to form a convex-lens-like shape.

The invention is not limited to the first and second embodiments but includes various modifications within the scope and spirit of the invention.

In the embodiments, a GaAlAs based material is used for a material to collect a light beam of a 0.8 to 0.9 micron short wavelength band, because absorption or transmission of a light beam in a material depends on whether the wavelength of the light beam is longer or shorter than the wavelength corresponding to the band gap of the material. Such a material as InAlAs, InAlP or InGaP may be used in place of the GaAlAs based material as a material to avoid restriction by band gap. A compound may be used for light collecting layer 27, which is expressed as $Al_xGa_yIn_{1-x-y}As_zP_{1-z}$ (0<x, y, x+y, z<1) combining at least one of Group 3 elements comprising Al, Ga and In and at least one of Group 5 elements comprising As and P.

In the second embodiment, in order to obtain lattice conformity, an exemplary method is shown which provides intermediate layer 25 between GaAlAs light collecting layer 27 and n-type InP buffer layer 12. The lattice constant of intermediate layer 25 is between those of light collecting layer 27 and buffer layer 12. Instead of providing intermediate layer 25, a composite rate of the compound, for example, a composite rate of Group 3 elements may be changed gradually to grow light collecting layer 26 in MOCVD in the step of FIG. 3B. By changing the composite rate, a lattice constant gap may be softened between light collecting layer 27 and buffer layer 12 effectively. For example, GaAlAs layer 26 may be formed by starting from GaAs growth, increasing amount of Al and decreasing amount of Ga gradually in MOCVD.

In this case, the lattice constant of a portion of the light collecting layer of the substrate side may differ from a lattice constant of the other portion of the light collecting layer, and may be between the lattice constant of the other portion and a lattice constant of the substrate (or buffer layer 12 formed on the substrate). GaAlAs Light collecting layer 27 or InAlAs intermediate layer 25 may contain impurities which give an n conductivity type. A convex curved surface may be formed in at least a portion of the surface of the light collecting layer to collect a light beam.

In the embodiments, light collecting layer 27 is grown which transmits a light beam of a short wavelength band, after InP buffer layer 12, light absorbing layer 13 and cap layer 14 are formed on an upper surface of n-type InP substrate 11. The layers 13 and 14 are removed by selective etching. Instead of adopting such a steps, a buffer layer, a light absorbing layer and a cap layer may be selectively grown on an n-type InP substrate under existence of a mask such as $SiO_2$, and after removing the mask, an intermediate layer and a light collecting layer may be selectively grown under existence of a mask such as $SiO_2$ on the cap layer.

Further, in the above mentioned method, the buffer layer may be formed on an entire surface of the substrate, and only the light absorbing layer and the cap layer may be selectively grown on the buffer layer under existence of a mask such as $SiO_2$.

The aforementioned embodiments show a case using light beams of a long wavelength band of 1.55 micron or 1.3 micron and a short wavelength band of 0.85 micron. The same concept as the semiconductor light receiving devices according to the embodiments may also be applied to a semiconductor light receiving device having sensitivity to such a shorter wavelength band as 0.78 micron or 0.65 micron. The incident light may be a light beam including both short and long wavelength bands as well as two light beams having short and long wavelength bands respectively. Even when the invention is applied to avalanche photo diodes, the same advantages as those of the photo diodes may be attained. The semiconductor light receiving devices according to the embodiments may operate even when each of the incident light beams may include both short and long wavelength bands. The incident light beams may a same light beam.

The embodiments of the invention may provide a semiconductor light receiving device and method of fabricating the device which is capable of receiving light beams including a long wavelength band to a short wavelength band, suppressing dark current and showing sufficient receiving light sensitivity.

What is claimed is:

1. A semiconductor light receiving device, comprising:
   a semiconductor substrate;
   a light absorbing layer of a first conductivity type formed on a semiconductor surface region of the semiconductor substrate, the light absorbing layer absorbing a light beam including a first wavelength band and a light beam including a second wavelength band having a shorter wavelength than the wavelength of the first wavelength band;
   a cap layer of the first conductivity type formed on the light absorbing layer;
   a region of a second conductivity type formed in the cap layer to transmit the light beam including the first wavelength band; and
   a light collecting layer formed on the semiconductor surface region adjacently to the cap layer and the light absorbing layer, the light collecting layer having a convex shape with curvature in at least a portion of a surface of the light collecting layer to transmit and collect the light beam including the second wavelength band to the light absorbing layer.

2. A semiconductor light receiving device according to claim 1, wherein a portion of the cap layer of the first conductivity type exists between the region of the second conductivity type and the light collecting layer.

3. A semiconductor light receiving device according to claim 1, wherein the region of the second conductivity type extends to the light absorbing layer.

4. A semiconductor light receiving device according to claim 1, wherein the cap layer is a InP layer and the light absorbing layer is a InGaAs layer.

5. A semiconductor light receiving device according to claim 1, wherein the band gap of the light absorbing layer is larger than the band gap of the cap layer.

6. A semiconductor light receiving device according to claim 1, wherein the light collecting layer is a compound expressed as $Al_xGa_yIn_{1-x-y}As_zP_{1-z}$ (0<x, y, x+y, z<1).

7. A semiconductor light receiving device according to claim 1, wherein an intermediate layer is formed between the semiconductor surface region and the light collecting layer, the intermediate layer having a lattice constant between a lattice constant of the semiconductor surface region and a lattice constant of the light collecting layer.

8. A semiconductor light receiving device according to claim 1, wherein the light collecting layer includes a first portion adjacent to the semiconductor surface region and a second portion apart from the semiconductor surface region, the first portion having a lattice constant between a lattice constant of the semiconductor surface region and a lattice constant of the second portion of the light collecting layer.

* * * * *